(12) United States Patent
Cho et al.

(10) Patent No.: US 11,588,027 B2
(45) Date of Patent: Feb. 21, 2023

(54) THIN FILM TRANSISTOR, AND DISPLAY PANEL AND DISPLAY APPARATUS USING THE SAME

(71) Applicant: LG Display Co., Ltd., Seoul (KR)

(72) Inventors: InTak Cho, Paju-si (KR); Jiyong Noh, Paju-si (KR); Jaeman Jang, Paju-si (KR); PilSang Yun, Paju-si (KR); Jeyong Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 177 days.

(21) Appl. No.: 17/131,284

(22) Filed: Dec. 22, 2020

(65) Prior Publication Data
US 2021/0193804 A1 Jun. 24, 2021

(30) Foreign Application Priority Data
Dec. 24, 2019 (KR) ........................ 10-2019-0173768

(51) Int. Cl.
| | | |
|---|---|---|
| G09G 3/32 | (2016.01) | |
| H01L 29/40 | (2006.01) | |
| H01L 27/12 | (2006.01) | |
| H01L 29/786 | (2006.01) | |
| H01L 21/765 | (2006.01) | |
| H01L 29/66 | (2006.01) | |
| H01L 21/02 | (2006.01) | |

(52) U.S. Cl.
CPC ............ *H01L 29/402* (2013.01); *G09G 3/32* (2013.01); *H01L 21/02565* (2013.01); *H01L 21/765* (2013.01); *H01L 27/124* (2013.01); *H01L 27/127* (2013.01); *H01L 27/1225* (2013.01); *H01L 29/66969* (2013.01); *H01L 29/7869* (2013.01); *G09G 2300/0408* (2013.01); *G09G 2300/08* (2013.01); *G09G 2310/0267* (2013.01); *G09G 2310/0286* (2013.01)

(58) Field of Classification Search
CPC ............. H01L 29/402; H01L 21/02565; H01L 21/765; H01L 27/1225; H01L 27/124; H01L 27/127; H01L 29/66969; H01L 29/7869; G09G 3/32; G09G 2300/0408; G09G 2300/08; G09G 2310/0267
See application file for complete search history.

(56) References Cited

U.S. PATENT DOCUMENTS

2017/0186831 A1* 6/2017 Nam .................... H01L 27/3272
2018/0059459 A1* 3/2018 Park .................... G02F 1/13454

FOREIGN PATENT DOCUMENTS

| KR | 10-2015-0075512 A | 7/2015 |
|---|---|---|
| KR | 10-2016-0009220 A | 1/2016 |

* cited by examiner

*Primary Examiner* — Robert J Michaud
(74) *Attorney, Agent, or Firm* — Birch, Stewart, Kolasch & Birch, LLP

(57) ABSTRACT

A thin film transistor, a display panel comprising the same and a display apparatus are discussed. The thin film transistor comprises a buffer layer embodied on a substrate, a semiconductor layer embodied on the buffer layer, including a channel area, a first conductor portion and a second conductor portion, a gate insulating film embodied on the semiconductor layer, a gate electrode embodied on the gate insulating film, and an auxiliary electrode overlapped with the second conductor portion, wherein the first conductor portion is extended from one side of the channel area, and becomes a source area, and the second conductor portion is extended from the other side of the channel area, and becomes a drain area.

19 Claims, 15 Drawing Sheets

THIN FILM TRANSISTOR, AND DISPLAY PANEL AND DISPLAY APPARATUS USING THE SAME

CROSS-REFERENCE TO RELATED APPLICATIONS

This application claims the priority benefit of the Korean Patent Application No. 10-2019-0173768 filed on Dec. 24, 2019 in the Republic of Korea, the entire contents of which are hereby expressly incorporated by reference as if fully set forth herein into the present application.

BACKGROUND

Technical Field

The present disclosure relates to a thin film transistor, a display panel comprising the same, and a display apparatus.

Discussion of the Related Art

A transistor is widely used as a switching element or a driving element in the field of electronic apparatuses. Particularly, since a thin film transistor (TFT) can be manufactured on a glass substrate or plastic substrate, the TFT is widely used as a switching element of a display apparatus such as a liquid crystal display apparatus or an organic light emitting apparatus.

The thin film transistor can be formed in various structures depending on the types of a material constituting an active layer, arrangement structures of electrodes (gate electrode, source electrode, and drain electrode), a method for forming a channel, etc.

Recently, an oxide semiconductor TFT (hereinafter, referred to as an oxide TFT), which has mobility higher than that of an amorphous silicon TFT and is easier for application of a large-sized area than a poly-silicon TFT, is widely used.

A main example of an oxide TFT structure is a coplanar structure in which a gate insulating layer and a gate electrode are deposited and patterned on an active layer, and a source electrode and a drain electrode, which are arranged on an inter-layer dielectric layer covering the deposited structure, are respectively connected with a source area and a drain area of the active layer through a contact hole that passes through the inter-layer dielectric layer.

A display apparatus includes a gate driver that applies a scan signal to a pixel through a gate line arranged on a display panel, and a structure that the gate driver is directly packaged in the display panel is referred to as a gate in panel (GIP) structure.

A switching TFT supplying a scan signal to a gate line is arranged in the gate driver, and a high voltage is applied to a drain of the switching TFT arranged in the gate driver in comparison with a TFT arranged in another area of the display apparatus.

If a high voltage is applied to the drain of the TFT, a TFT on current Ion is deteriorated instantaneously. This Ion deterioration causes a panel defect, whereby a problem occurs in that production yield of the panel is deteriorated.

It is noted from the result of an experiment that the Ion deterioration generated when the high voltage is applied to the drain is caused by an electric field concentrated on a boundary area between a channel area and a drain area and an area of the drain area arranged at a lower portion of a GI tail of the gate insulating film.

SUMMARY OF THE INVENTION

The present disclosure has been made in view of the above problems and other limitations associated with the related art, and it is an object of the present disclosure to provide a thin film transistor, a display panel comprising the same, and a display apparatus, in which the thin film transistor includes electric field control electrodes asymmetrically toward a drain area based on a channel area below a semiconductor layer.

It is another object of the present disclosure to provide a thin film transistor, a display panel comprising the same, and a display apparatus, in which the thin film transistor is embodied to reduce an electric field concentrated on a lower portion of a GI tail of the gate insulating film by using a voltage applied to electric field control electrodes formed below a semiconductor layer.

It is other object of the present disclosure to provide a thin film transistor, a display panel comprising the same, and a display apparatus, in which the thin film transistor is embodied to prevent Ion deterioration generated when a high voltage is applied to a drain from occurring by reducing an electric field concentrated on a lower portion of a GI tail of the gate insulating film.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising a buffer layer on a substrate, a semiconductor layer on the buffer layer, and including a channel area, a first conductor portion and a second conductor portion, a gate insulating film on the semiconductor layer, a gate electrode on the gate insulating film, and an auxiliary electrode overlapped with the second conductor portion, the first conductor portion is extended from one side of the channel area, and becomes a source area, and the second conductor portion is extended from the other side of the channel area, and becomes a drain area.

In accordance with another aspect of the present disclosure, the above and other objects can be accomplished by the provision of a display panel comprising a substrate having a display area and a non-display area, a plurality of pixels disposed in the display area and connected to gate and data lines, and a gate driver disposed in the non-display area, having a shift register circuit for driving the gate line, the shift register circuit including a plurality of thin film transistors disposed on the substrate, and at least one of the plurality of thin film transistors comprises a buffer layer on a substrate, a semiconductor layer on the buffer layer, including a channel area, a first conductor portion and a second conductor portion, a gate insulating film on the semiconductor layer, a gate electrode on the gate insulating film, and an auxiliary electrode overlapped with the second conductor portion, the first conductor portion is extended from one side of the channel area, and becomes a source area, and the second conductor portion is extended from the other side of the channel area, and becomes a drain area.

In accordance with other aspect of the present disclosure, the above and other objects can be accomplished by the provision of a display panel comprising a thin film transistor according to the embodiment of the present disclosure.

Details according to various embodiments of the present disclosure in addition to the solutions to the above problems and limitations are included in the following description and drawings.

The thin film transistor according to the present disclosure includes electric field control electrodes asymmetrically toward a drain area based on a channel area below a semiconductor layer, and can control an electric field concentrated on a lower portion of a GI tail of a gate insulating film by using a voltage applied to the electric field control electrodes.

Therefore, Ion deterioration generated when a high voltage is applied to a drain can be prevented from occurring by reducing an electric field concentrated on a lower portion of a GI tail of a gate insulating film through control of the voltage applied to the electric field control electrodes.

Also, since a panel defect caused by the Ion deterioration can be prevented from occurring, panel production yield can be enhanced when a display panel of a large area/high resolution is manufactured.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
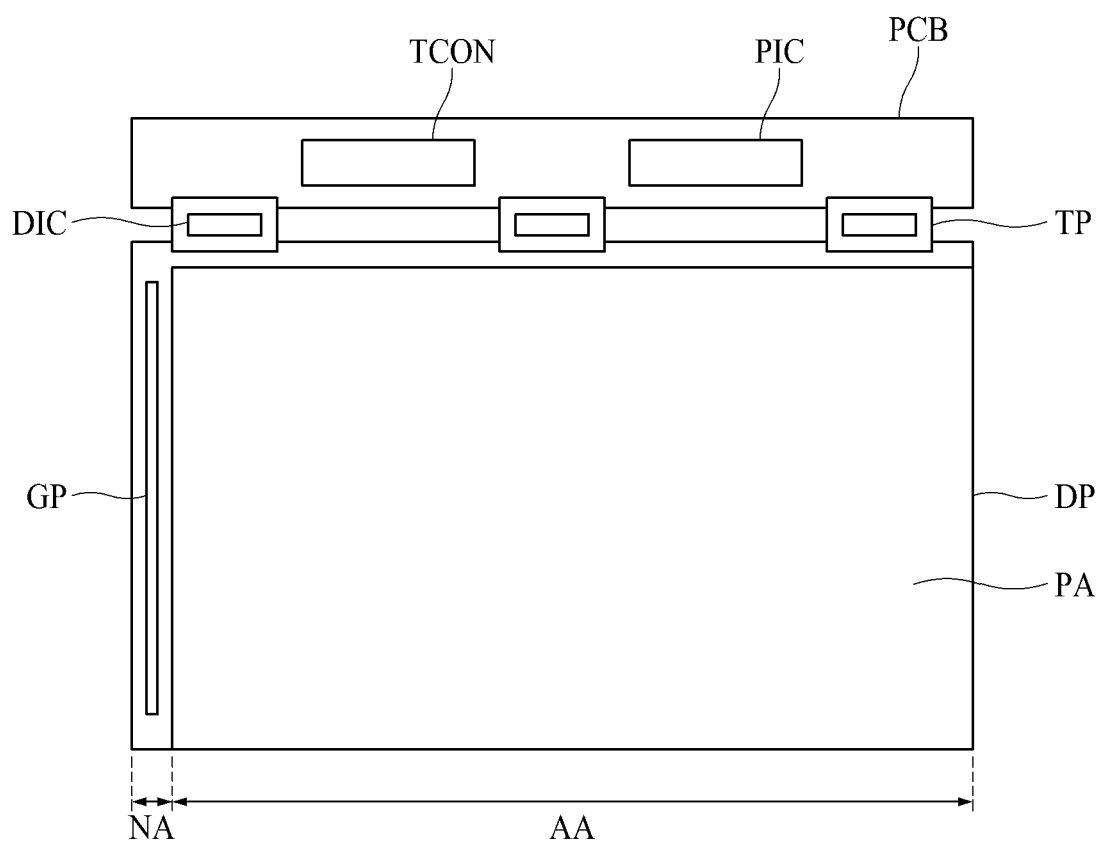
FIG. 1 is a plane view illustrating a schematic structure of a display apparatus comprising a GIP type gate driver provided with a thin film transistor according to one embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise", "have", and "include" described in the present specification are used, another part can also be present unless "only" is used. The terms in a singular form can include plural forms unless noted to the contrary.

In construing an element, the element is construed as including an error range although there is no explicit description thereof.

In describing a positional relationship, for example, when the positional order is described as "on", "above", "below", and "next", the case of no contact therebetween can be included, unless "just" or "direct" is used.

Spatially relative terms such as "below", "beneath", "lower", "above", and "upper" can be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device can be arranged "above" another device. Therefore, an exemplary term "below or beneath" can include "below or beneath" and "above" orientations. Likewise, an exemplary term "above" or "on" can include "above" and "below or beneath" orientations.

In describing a temporal relationship, for example, when the temporal order is described as "after", "subsequent", "next" and "before" a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

In the drawings, the same or similar elements are denoted by the same reference numerals even though they are depicted in different drawings.

Hereinafter, an example of a thin film transistor, a display panel comprising the same and a display apparatus according to the embodiment of the present disclosure will be described in detail with reference to the accompanying drawings.

Figure 2:
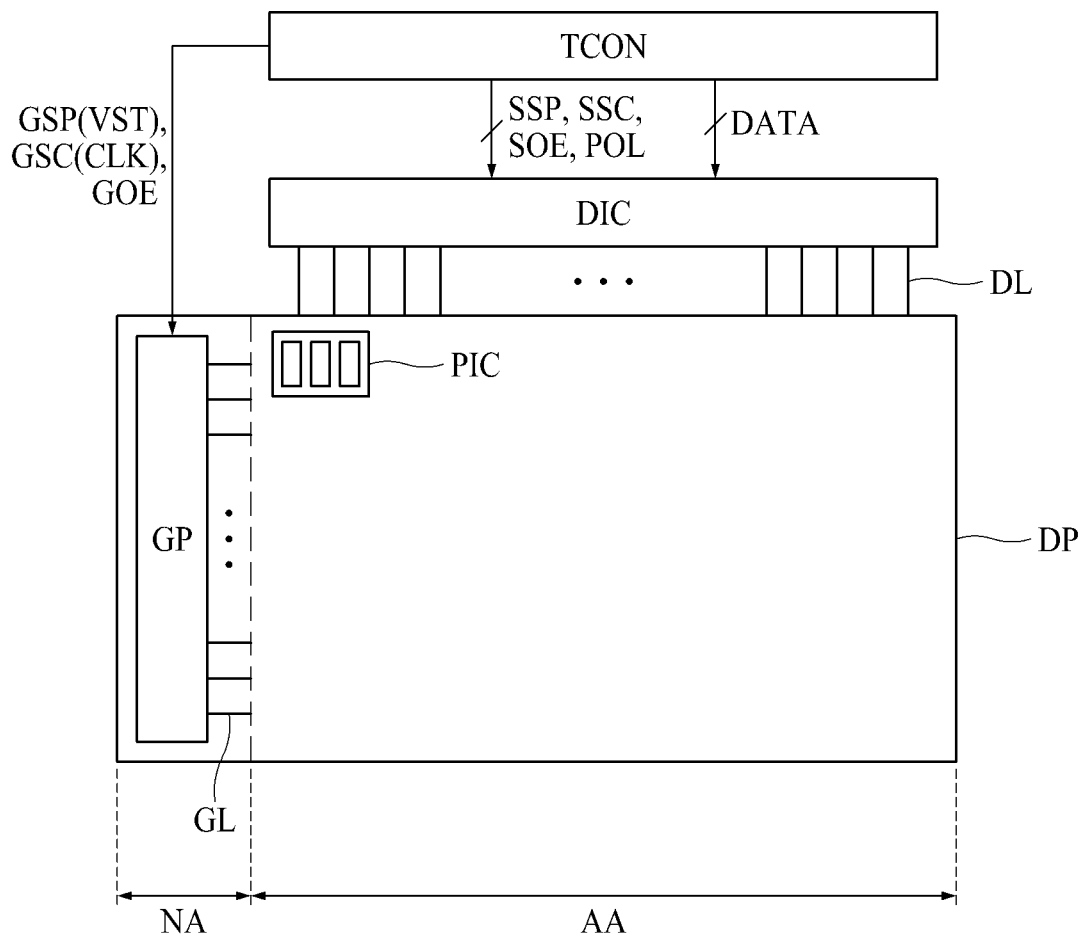
FIG. 2 is a schematic view illustrating a detailed structure of the display apparatus of FIG. 1.
Figure 3:
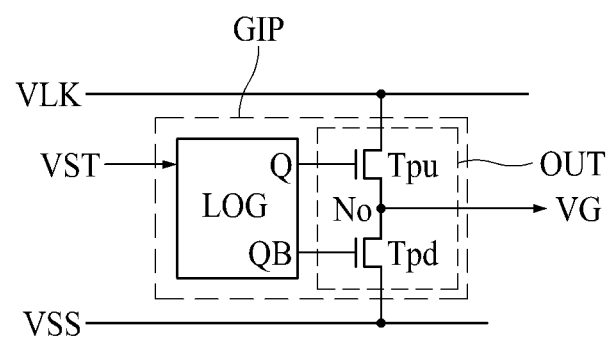
FIG. 3 is a view illustrating a circuit configuration of an example of a shift register of a gate driver shown in FIG. 2.

FIG. 1 is a plane view illustrating a schematic structure of a display apparatus comprising a GIP type gate driver provided with a thin film transistor according to the embodiment of the present disclosure, FIG. 2 is a schematic view illustrating a detailed structure of the display apparatus of FIG. 1, and FIG. 3 is a view illustrating a circuit configuration of an example of a shift register of a gate driver shown in FIG. 2. All the components of the display apparatus according to all embodiments of the present disclosure are operatively coupled and configured.

Hereinafter, a structure of the display apparatus and a circuit configuration for the shift register of the gate driver, which will be described with reference to FIGS. 1 to 3, are intended to describe technical spirits of the present disclosure, and the structure of the display apparatus and the circuit configuration for the shift register of the gate driver can be changed in various ways.

Referring to FIG. 1, a data driver DIC connected to a data line of a display panel DP in a TAB type is disposed at one side of an upper end of the display panel DP. On the other hand, a gate driver GIC is not provided separately, and a GIP type gate driver GP is directly packaged in a non-display area NA which is an external area at one side of a display area AA provided with a pixel area PA directly displaying video data in the display panel DP.

The GIP type enables slimness for a bezel area of the display apparatus in comparison with the TAB type, and thus has advantages in that it can enhance external appearance and reduce the cost.

Referring to FIG. 2, the GIP type display apparatus includes a display panel DP, a controller TCON, and a data driver DIC. The display panel DP is comprised of a display area AA provided with a pixel area PA displaying video data and a non-display area NA provided with a gate driver GP.

Particularly, the display area AA of the display panel DP includes signal lines formed on a glass substrate, and comprised of a plurality of data lines DL and a plurality of gate lines GL crossing the data lines DL. A plurality of pixels PIC are disposed in the display area AA provided with the pixel area PA of the display panel DP in the form of matrix arrangement by an intersection structure of the signal lines DL and GL. Each of the pixels PIC can include a red subpixel, a green subpixel and a blue subpixel. At this time, each subpixel includes at least one thin film transistor and at least one capacitor, and can be a liquid cell displaying an image by driving a liquid crystal in accordance with an electric field based on a data signal or a self-light emitting cell displaying an image by emitting light in accordance with a current based on a data signal.

The controller TCON supplies RGB data of a video image input from a video source to the data driver DIC. Also, the controller TCON generates control signals for controlling an operation timing of the drivers DIC and GP by using timing signals such as a vertical synchronization signal Vsync, a horizontal synchronization signal Hsync, a data enable signal DE, and a dot clock DCLK.

A data control signal for controlling the operation timing of the data driver DIC includes a source start pulse SSP indicating a start point of data in one horizontal period where data of one horizontal line are displayed, a source sampling clock SSC controlling a latch operation of data based on a rising or falling edge, a source output enable signal SOE controlling an output of the data driver DIC, and a polarity control signal POL controlling a polarity of a data voltage to be supplied to the display panel DP.

A gate control signal for controlling the operation timing of the gate driver GP includes a gate start pulse GSP indicating a start horizontal line where scan starts in one vertical period where one screen is displayed, a gate shift clock signal GSC input to the shift register in the gate driver GP, sequentially shifting gate start pulses GSP, and a gate output enable signal GOE controlling an output of the gate driver GP.

The data driver DIC is intended to drive the data lines DL, and includes a shift register, a latch, a digital-to-analog converter DAC, and an output buffer. The data driver DIC latches video data in accordance with the data control signals SSP, SSC and SOE. The data driver DIC converts the video data to an analog positive gamma compensation voltage and an analog negative gamma compensation voltage in response to the polarity control signal POL and inverts the polarity of the data voltage. The data driver DIC outputs the data voltage to the data lines DL to allow the data voltage to be synchronized with a main scan pulse output from the gate driver GP.

The gate driver GP includes a plurality of shift registers (shift register array) to sequentially supply a scan signal VG (gate driving signal) to each of a plurality of gate lines GL. The shift register array of the gate driver GP is formed in the non-display area NA outside the display area AA provided with the pixels PIC in the display panel DP in a GIP type. The plurality of shift registers of the GIP type gate driver may be formed together with a TFT of a pixel in a TFT process of the pixels PIC.

Each of the plurality of shift registers sequentially supplying scan pulses of a turn-on level to the gate lines includes a plurality of thin film transistors, and the plurality of thin film transistors can be thin film transistors according to the embodiment of the present disclosure.

The shift register circuit includes the plurality of thin film transistors disposed on a substrate, and at least one of the thin film transistors is the thin film transistor according to the embodiment of the present disclosure.

Figure 4:
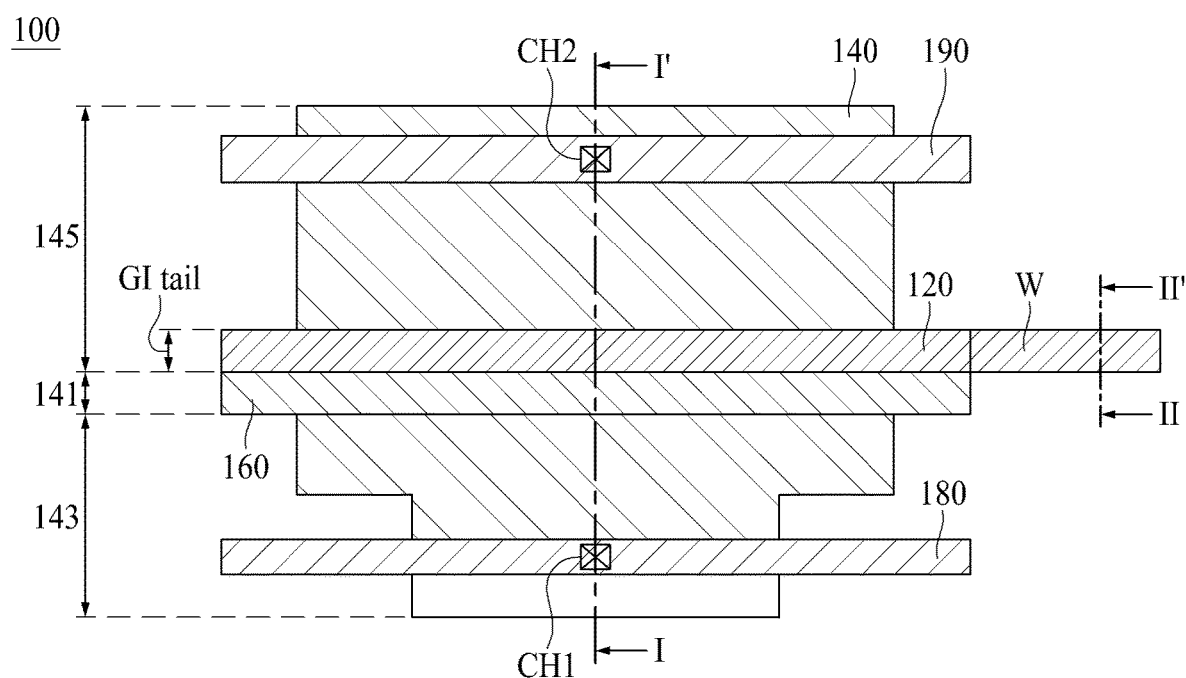
FIG. 4 is a plane view illustrating a thin film transistor according to one embodiment of the present disclosure, which is provided in the GIP type gate driver of FIG. 1.
Figure 5:
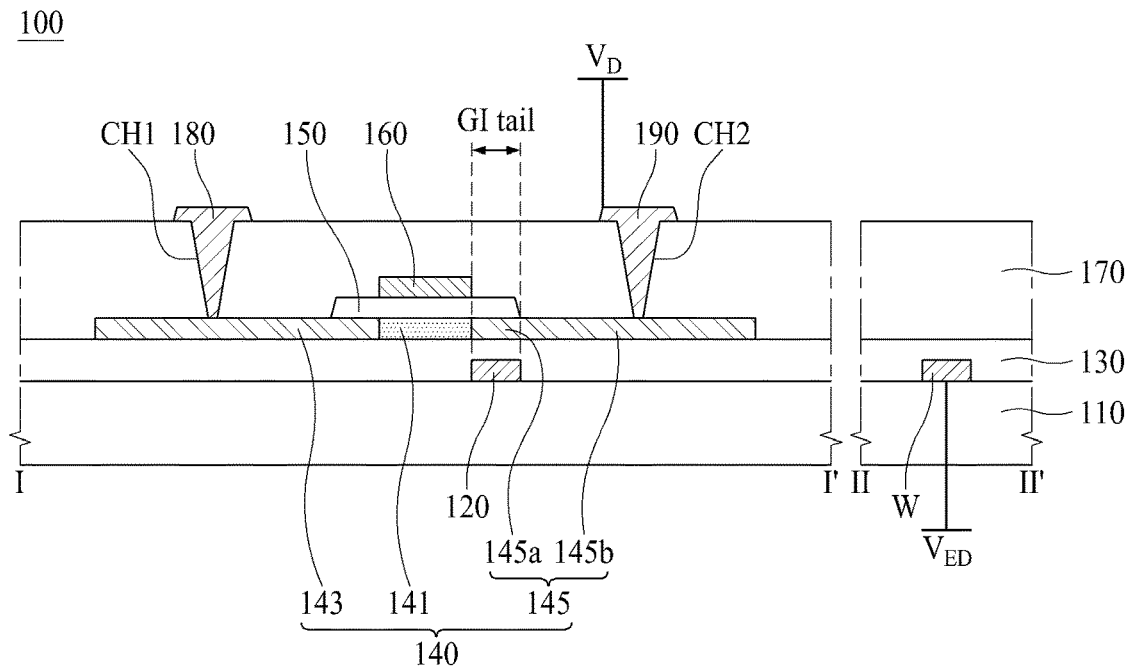
FIG. 5 is a cross-sectional view illustrating the thin film transistor taken along lines I-I' and II-II' of FIG. 4.

FIG. 4 is a plane view illustrating a thin film transistor according to one embodiment of the present disclosure, which is provided in a GIP type gate driver of FIG. 1, and FIG. 5 is a cross-sectional view illustrating the thin film transistor taken along line I-I' and line II-II' of FIG. 4.

Although FIG. 4 illustrates that the thin film transistor 100 according to one embodiment of the present disclosure is formed in a top gate structure in which a gate electrode 160 is arranged above a semiconductor layer 140, the thin film transistor 100 can be formed in a bottom gate structure in which the gate electrode 160 is arranged below the semiconductor layer 140.

Referring to FIGS. 4 and 5, the thin film transistor 100 according to one embodiment of the present disclosure includes a first electrode 120 formed on a substrate 110, a buffer layer 130 formed on the substrate 110 to cover the first electrode 120, a semiconductor layer 140 on the buffer layer 130, a gate insulating film 150 on the semiconductor layer 140, and a gate electrode 160 on the gate insulating film 150.

The semiconductor layer 140 includes a channel portion 141 (or channel area) of a center area, and first and second conductor portions 143 and 145 respectively disposed at both sides based on the channel area 141. One of the conductor portions 143 and 145 is a source area and the other one is a drain area. For description, it is assumed that the first conductor portion 143 is a source area and the second conductor portion 145 is a drain area.

The gate insulating film 150 includes a tail (GI tail) which is an area not overlapped with the gate electrode 160, and the GI tail of the gate insulating film 150 can be formed at both the first conductor portion 143 and the second conductor portion 145. However, a description will be given based on the GI tail formed at the second conductor portion 145. The GI tail which will be described means a tail formed at the second conductor portion 145.

The second conductor portion 145 defined as a drain area includes a first area 145a (boundary area) overlapped with the GI tail of the gate insulating film 150 and a second area 145b (contact area) facing the channel area 141 based on the first area 145a so as not to overlap the GI tail of the gate insulating film 150, connected with a third electrode 190 (drain electrode).

The thin film transistor 100 can include an insulating film 170 formed on the buffer layer 130 to cover an element therebelow, a second electrode 180 formed on the insulating film 170 and connected with the first conductor portion 143 through a first contact hole CH1, and a third electrode 190 formed on the insulating film 170 and connected with the second conductor portion 145 through a second contact hole CH2.

A glass or plastic can be used as the substrate 110. A transparent plastic having flexible characteristic, for example, polyimide can be used as the plastic. If the polyimide is used as the substrate 110, a heat-resistant polyimide durable at a high temperature can be used considering that a high temperature deposition process is performed on the substrate 110.

The first electrode 120 is formed on the substrate 110 to overlap the GI tail of the gate insulating film 150. As described above, the GI tail of the gate insulating film 150 is an area of the gate insulating film 150 corresponding to an area of the second conductor portion 145 that is not overlapped with the gate electrode 160.

For example, the first electrode 120 can be expressed as an auxiliary electrode, a drain auxiliary electrode, or an electric field control electrode.

The first electrode 120 is formed at only the second conductor portion 145 which becomes the drain area based on the center of the channel area 141 of the semiconductor layer 140.

The first electrode 120, for example, can be formed of, but not limited to, at least one selected from a conductive metal group that includes Al, W, Cu, Mo, Cr, Ti, MoW, MoTi, and Cu/MoTi.

The first electrode 120 is disposed to prevent Ion deterioration by reducing an electric field concentrated on the first area 145a when a high voltage is applied to the second conductor portion 145 and thus lowering a resistance. Since Ion deterioration is prevented from occurring, mobility of a carrier can be improved.

To this end, a voltage $V_{ED}$ (electric field drop voltage) for reducing the electric field generated in the first area 145a is applied to the first electrode 120, and the electric field drop voltage can be set in accordance with a voltage $V_D$ (drain voltage) applied to the second conductor portion 145.

However, if a negative (−) voltage is applied as the electric field drop voltage $V_{ED}$, a threshold voltage Vth of the TFT moves to a positive (+) voltage, whereby reliability margin can be reduced. If a voltage more than the drain voltage $V_D$ is continuously applied as the electric field drop voltage $V_{ED}$, the semiconductor layer 140 is continuously exposed to the electric field drop voltage $V_{ED}$ which is a high voltage, whereby TFT operation reliability may not be maintained. Therefore, it is preferable that a positive (+) voltage lower than the drain voltage $V_D$ is applied as the electric field drop voltage $V_{ED}$.

The first electrode 120 is connected with a power applying means for applying the electric field drop voltage $V_{ED}$ through a power line W. For example, the first electrode 120 is connected with the power line W that is supplied with the electric field drop voltage $V_{ED}$ from the power applying means. For description, the first electrode 120 is detached from the power line W in this embodiment but the first electrode 120 and the power line W can be areas detached from each other in one conductor.

The buffer layer 130 can fully be formed on the substrate 110 and cover the first electrode 120, and can be formed of an inorganic material or an organic material. For example, the buffer layer 130 can include an insulating oxide such as $SiO_x$, $Al_2O_3$, $HfO_3$, and $Y_2O_3$.

The buffer layer 130 protects the semiconductor layer 140 by blocking particles such as water and oxygen permeated from the substrate 110, and serves to planarize the upper portion of the substrate 110 provided with the first electrode 120, and can be formed of a single layer or multiple layers.

The semiconductor layer 140 can be formed on the buffer layer 130, can include an oxide semiconductor material, and can be formed of a single layer but can be formed of a multi-layered structure of two or more layers.

For example, the semiconductor layer 140 can include at least one of IZO (InZnO)-, IGO(InGaO)-, ITO (InSnO)-, IGZO(InGaZnO)-, IGZTO (InGaZnSnO), GZTO (GaZnSnO)-, GZO (GaZnO)-, and ITZO (InSnZnO)-based oxide semiconductor materials. The semiconductor layer 140 is not limited to the above materials, and can include other oxide semiconductor materials known in the art.

As described above, the semiconductor layer 140 includes a channel area 141 overlapped with a gate electrode 160, and first and second conductor portions 143 and 145 respectively disposed at both sides based on the channel area 141 so as not to overlap the gate electrode 160, the first conductor portion 143 is a source area and the second conductor portion 145 is a drain area.

The second conductor portion 145 includes a first area 145a (boundary area) overlapped with the GI tail of the gate insulating film 150 and a second area 145b (contact area) facing the channel area 141 based on the first area 145a so as not to overlap the GI tail of the gate insulating film 150.

The gate insulating film 150 is formed on the semiconductor layer 140, and can be formed on only the channel area 141 of the semiconductor layer 140 but can be formed to fully cover the upper portion of the semiconductor layer 140.

The gate insulating film 150 can include an inorganic film, for example, at least one of $SiO_x$ and $SiN_x$, or can include $Al_2O_3$, and can have a single film structure or multi-layered film structure.

The gate electrode 160 is formed on the gate insulating film 150, and is overlapped with at least the channel area 141 of the semiconductor layer 140.

The gate electrode 160 can be overlapped with not only the channel area 141 of the semiconductor layer 140 but also at least a portion of the conductor portions 143 and 145 of the semiconductor layer 140. In this case, at least a portion of the gate electrode 160 overlapped with the channel area 141 of the semiconductor layer 140 serves to turn on/off the thin film transistor, and at least a portion of the gate electrode 160 overlapped with the conductor portions 143 and 145 of the semiconductor layer 140 forms a capacitor together with the conductor portions 143 and 145 of the semiconductor layer 140.

The gate electrode 150 can include at least one of Al based metal such as Al or Al alloy, Ag based metal such as Ag or Ag alloy, Cu based metal such as Cu or Cu alloy, Mo based metal such as Mo or Mo alloy, Cr, Ta, Nd and Ti, and can be formed of a single layer or a multi-layer of two or more layers.

The insulating film 170 may be fully formed on the buffer layer 130, protects the elements therebelow by covering the elements therebelow, planarizes the upper portion of the thin film transistor 100, and can be used as an inter-layer dielectric (ILD) film.

The insulating film 170 can be made of an inorganic material, an organic material, or a deposited body of an organic material layer and an inorganic material layer, and can be formed of a single layer but can be formed of a multi-layered structure of two or more layers.

The first contact hole CH1 connected with the first conductor portion 143 is formed to pass through the insulating film 170, and the second contact hole CH2 connected with the second conductor portion 145 is formed to pass through the insulating film 170.

The second electrode 180 is formed on the insulating film 170 and connected with the first conductor portion 143 through the first contact hole CH1 formed in the insulating film 170, and the third electrode 190 is formed on the insulating film 170 and connected with the second conductor portion 145 through the second contact hole CH2 formed in the insulating film 170.

Each of the second and third electrodes 180 and 190 can be formed of a single layer or multi-layer made of any one of Mo, Al, Cr, W, Ti, Ni, Nd and Cu or their alloy.

In this way, the electric field control electrode 120 is formed below the semiconductor layer 140 to overlap the GI tail of the gate insulating film 150, and the electric field drop voltage $V_{ED}$ is applied to the electric field control electrode 120, whereby the electric field formed in the boundary area 145a of the second conductor portion 145 arranged below the GI tail of the gate insulating film 150 can be reduced.

Therefore, the electric field formed in the boundary area 145a of the second conductor portion 145 can be reduced through control of the electric field drop voltage $V_{ED}$ applied to the electric field control electrode 120, whereby Ion deterioration generated when the drain voltage $V_D$ of a high voltage is applied to the second conductor portion 145 can be prevented from occurring.

Also, since a panel defect caused by the Ion deterioration can be avoided, panel production yield can be enhanced when a display panel of a large area/high resolution is manufactured.

FIGS. 6 to 16 are cross-sectional views illustrating a thin film transistor according to other embodiments of the present disclosure. Hereinafter, various embodiments related to the first electrode 120 of the present disclosure will be described with reference to FIGS. 6 to 16.

Figure 6:
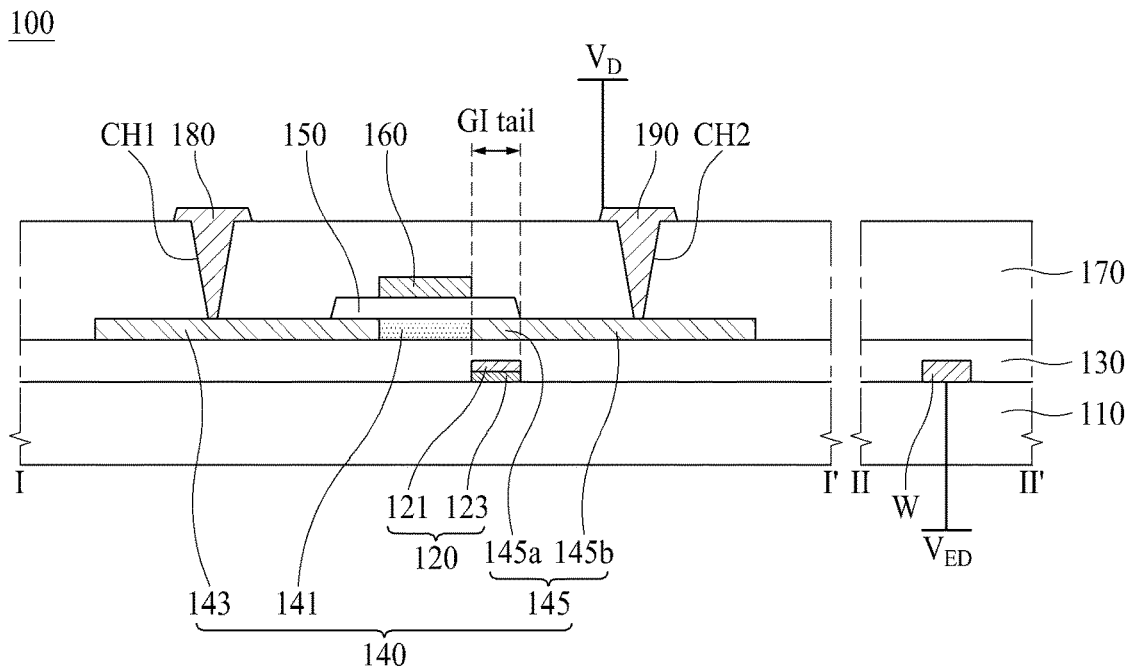
FIGS. 6 to 16 are cross-sectional views illustrating a thin film transistor according to other embodiments of the present disclosure.

The first electrode 120 can be formed of a multi-layered structure. Although FIG. 6 illustrates that the first electrode 120 is formed of a multi-layered structure of two layers that include a first conductive layer 121 and a second conductive layer 123 formed on the first conductive layer 121, the first electrode 120 can be formed of a multi-layered structure of three or more layers.

Figure 7:
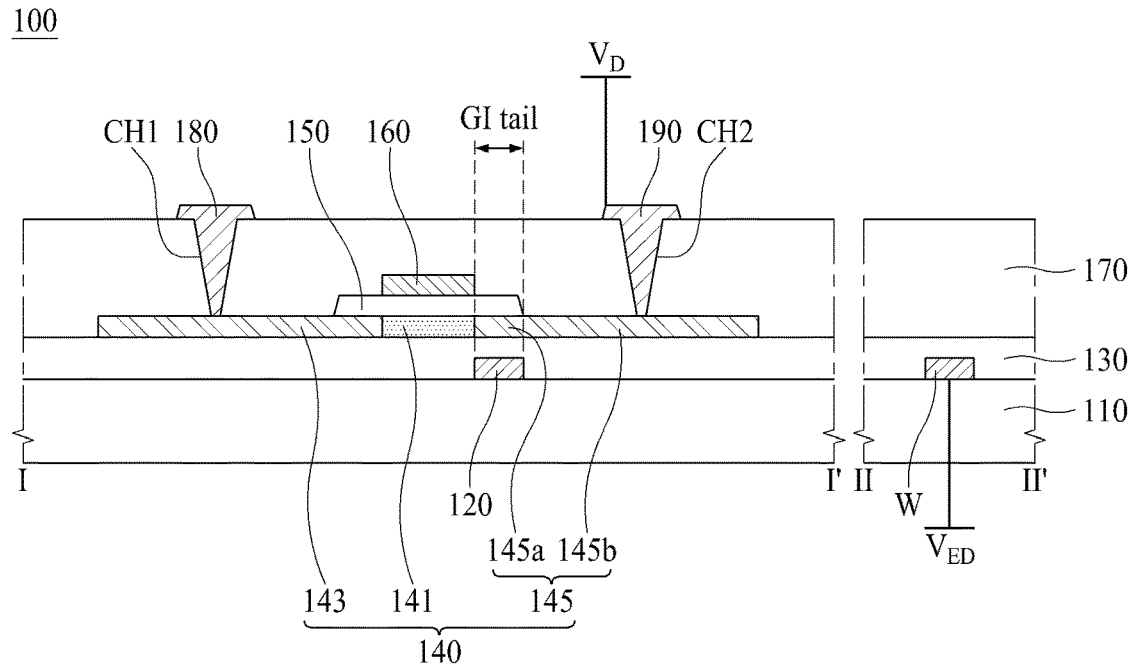
Figure 8:
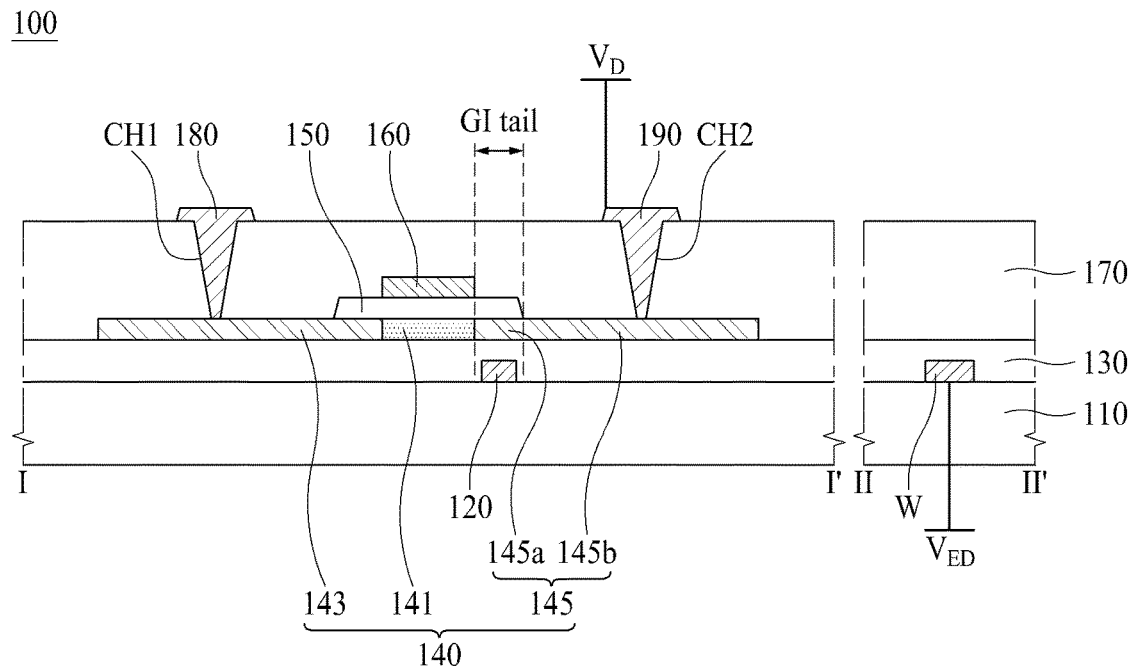
Figure 9:
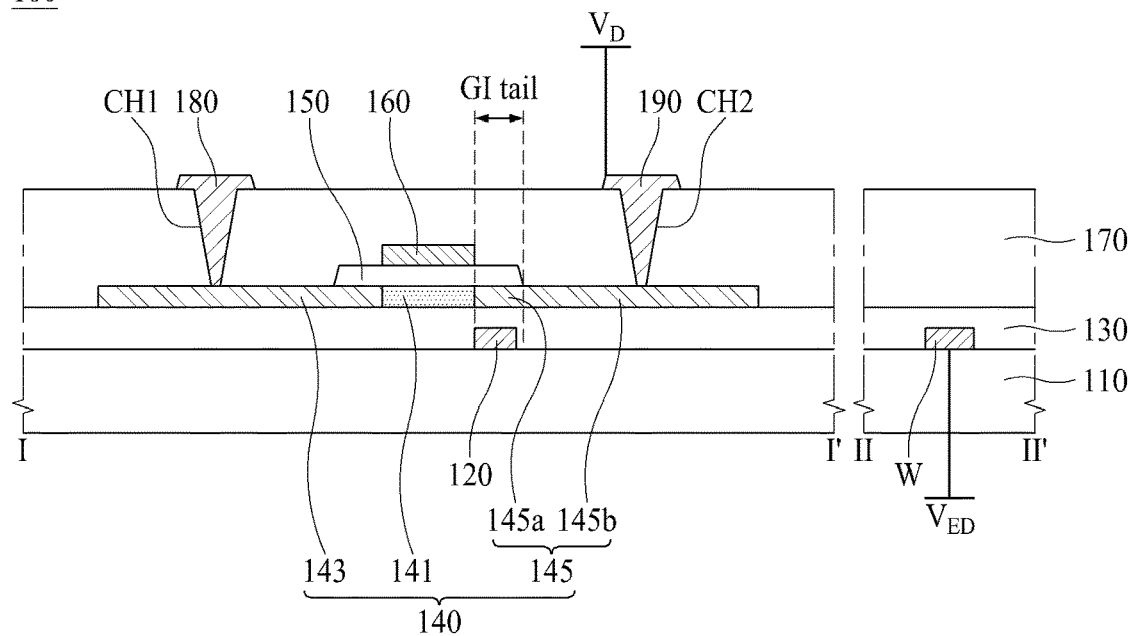
Figure 10:
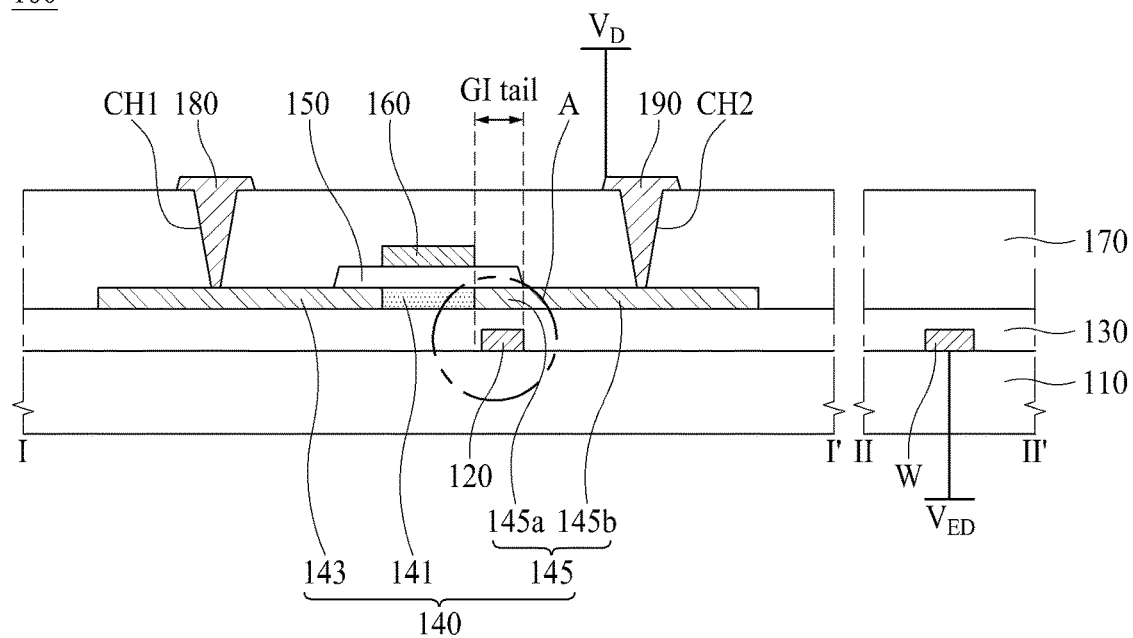

The first electrode 120 can be formed to fully overlap the first area 145a of the second conductor portion 145 as shown in FIG. 7, or can be formed to partially overlap the first area 145a of the second conductor portion 145 as shown in FIGS. 8 to 10.

Figure 11:
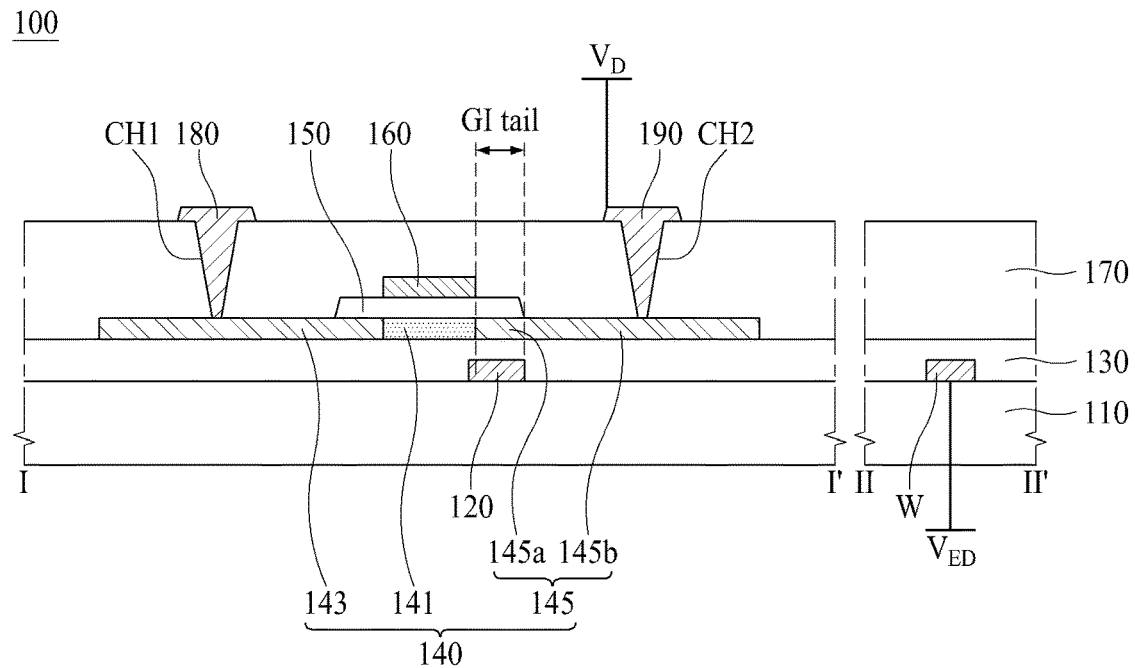
Figure 12:
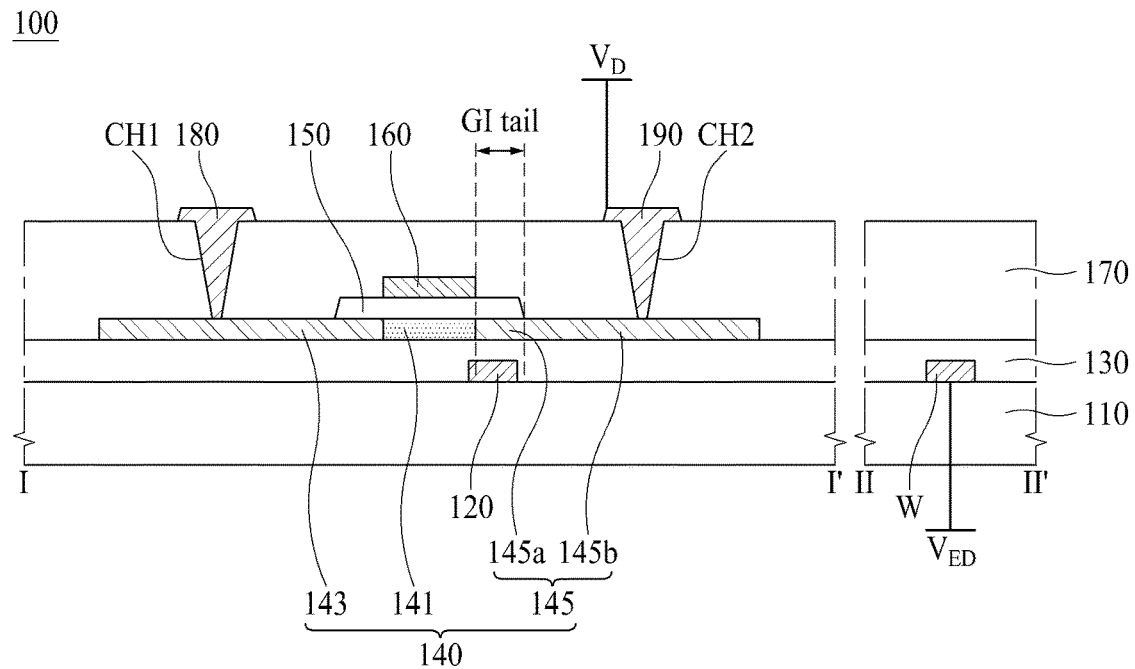

As shown in FIGS. 11 and 12, the first electrode 120 can be formed to overlap the first area 145a of the second conductor portion 145 and the channel area 141.

In detail, the first electrode 120 can be formed to overlap the channel area 141 while fully overlapping the first area 145a of the second conductor portion 145 (FIG. 11), or can be formed to overlap the channel area 141 while partially overlapping the first area 145a of the second conductor portion 145 (FIG. 12).

Figure 13:
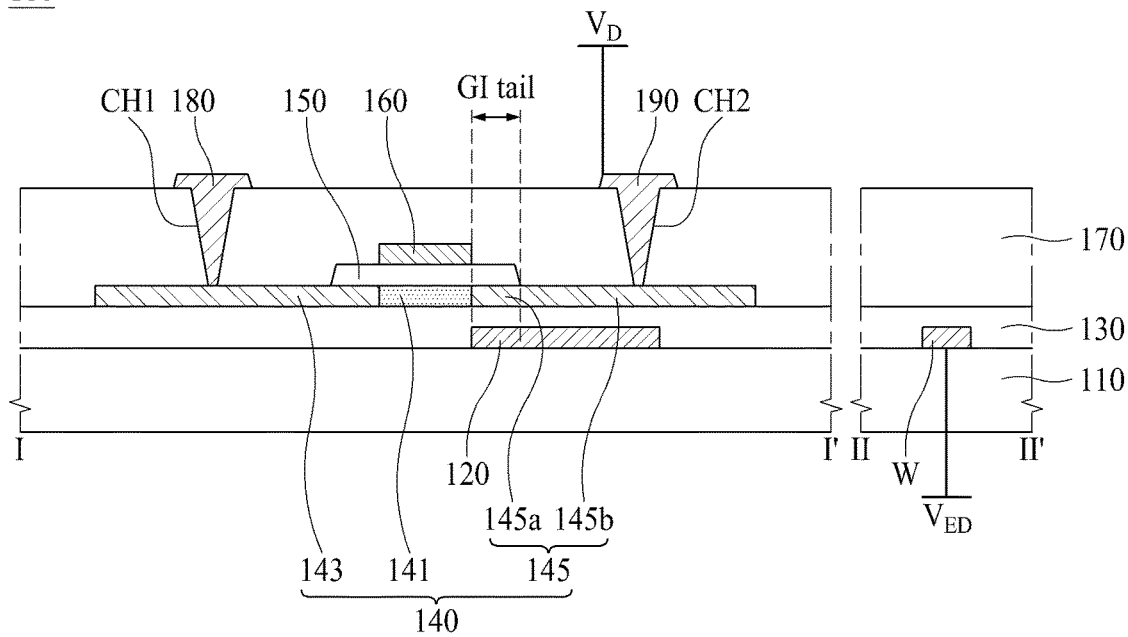
Figure 14:
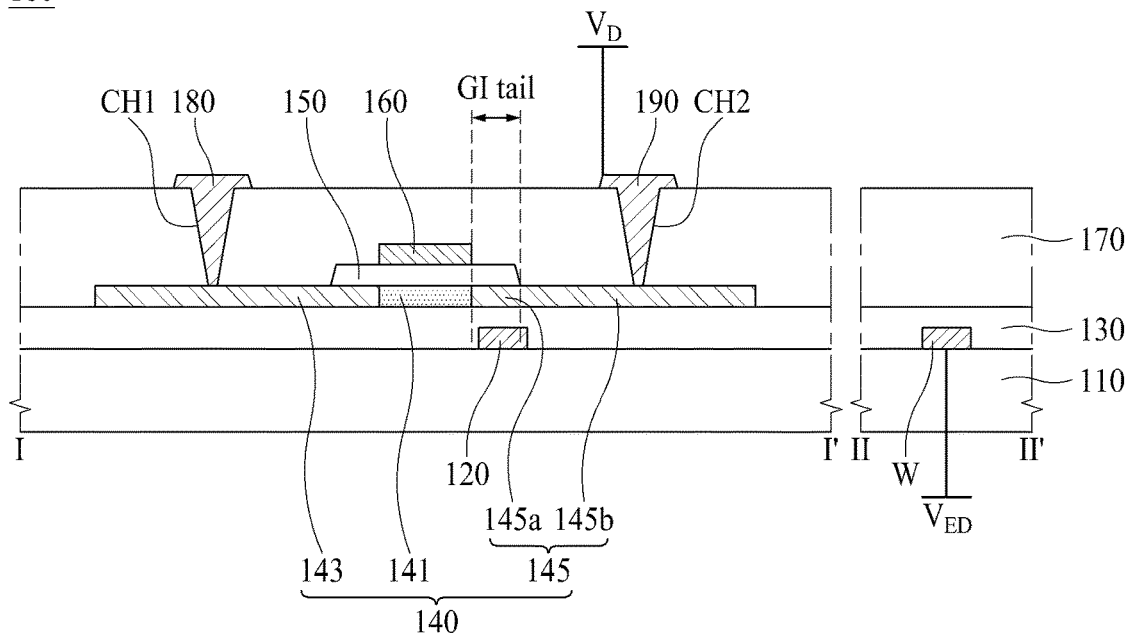

As shown in FIGS. 13 and 14, the first electrode 120 can be formed to overlap the first area 145a and the second area 145b of the second conductor portion 145.

In detail, the first electrode 120 can be formed to overlap the second area 145b while fully overlapping the first area 145a of the second conductor portion 145 (FIG. 13), or can be formed to overlap the second area 145b while partially overlapping the first area 145a of the second conductor portion 145 (FIG. 14).

The first electrode 120 is overlapped with the second area 145b without limitation, and can be extended to overlap the third electrode 190 as shown in FIG. 13 and can fully be overlapped with the second area 145b.

Figure 15:
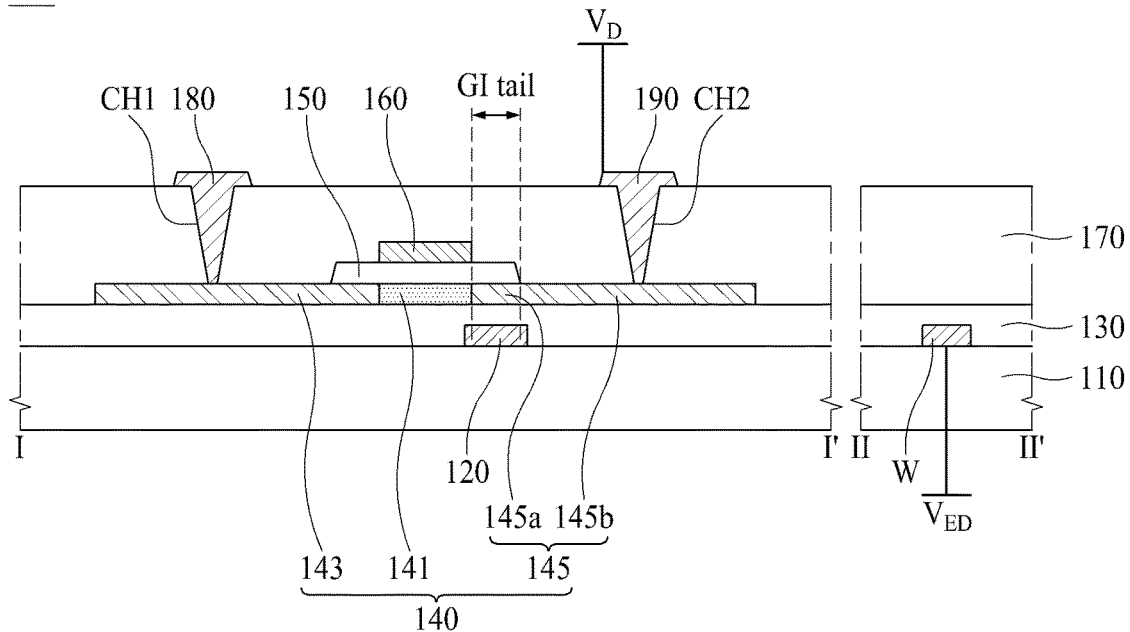

As shown in FIG. 15, the first electrode 120 can be formed to overlap the channel area 141 and the first and second areas 145a and 145b of the second conductor portion 145.

However, since the operation of the TFT should not be affected by the electric field drop voltage $V_{ED}$ applied to the first electrode 120, the first electrode 120 can be overlapped with the channel area 141 under the condition that it does not affect the operation of the TFT.

As described above, the first electrode 120 can further be overlapped with at least one of the channel area 141 and the second area 145b of the second conductor portion 145 while overlapping the first area 145a of the second conductor portion 145 although different depending on the embodiments. However, if the first electrode 120 is overlapped with the first conductor portion 143 as the source area, it affects the operation of the thin film transistor, whereby the first electrode 120 is not overlapped with the first conductor portion 143.

Figure 16:
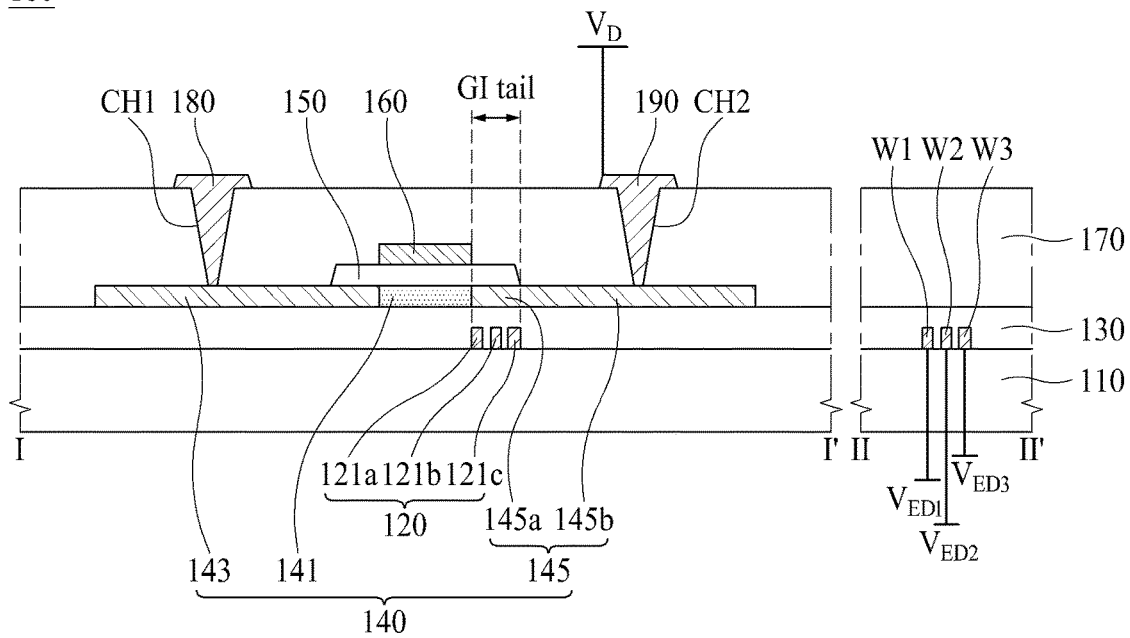

As shown in FIG. 16, the first electrode 120 can include a plurality of sub electrodes 120a, 120b and 120c spaced apart from one another, and the same electric field drop voltage $V_{ED}$ can be applied to each of the sub electrodes 120a, 120b and 120c or different electric field drop voltages $V_{ED1}$, $V_{ED2}$, and $V_{ED3}$ can be applied thereto.

For example, electric field strength can be changed per position in the first area 145a of the second conductor portion 145, and if the electric field drop voltage $V_{ED}$ corresponding to electric field strength per position is applied to each of the sub electrodes, the electric field formed in the first area 145a of the second conductor portion 145 can accurately be controlled.

FIG. 16 illustrates that the sub electrodes 120a, 120b and 120c are respectively connected with power lines W1, W2 and W3 supplied with electric field drop voltages $V_{ED1}$, $V_{ED2}$, and $V_{ED3}$ from the power applying means.

The structure of the thin film transistor according to the embodiments of the present disclosure has been described as above with reference to FIGS. 4 to 16. Hereinafter, a method for manufacturing a thin film transistor according to one embodiment of the present disclosure will be described with reference to FIGS. 17A to 17H.

FIGS. 17A to 17H are views illustrating a method for manufacturing a thin film transistor according to one embodiment of the present disclosure.

Figure 17A:
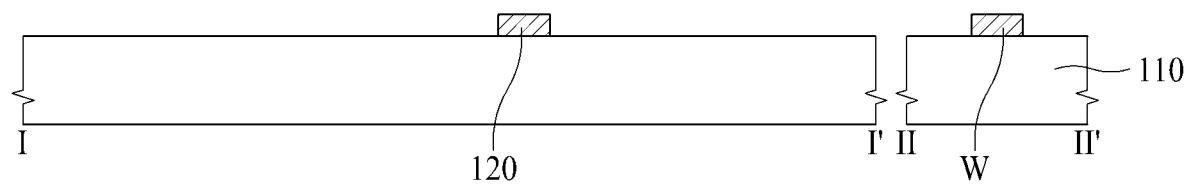
FIGS. 17A to 17H are views illustrating a method for manufacturing a thin film transistor according to one embodiment of the present disclosure.

First of all, as shown in FIG. 17A, the first electrode 120 is formed to be patterned on the substrate 110.

A glass or plastic can be used as the substrate 110. A transparent plastic having flexible characteristic, for example, polyimide can be used as the plastic.

If the plastic is used as the substrate 110, a process such as deposition and etching can be performed in a state that the plastic substrate is disposed on a carrier substrate made of a high durable material such as glass.

The first electrode 120, for example, can be formed of at least one selected from a conductive metal group that includes Al, W, Cu, Mo, Cr, Ti, MoW, MoTi, and Cu/MoTi.

If the first electrode 120 is formed, the power line W supplied with the electric field drop voltage $V_{ED}$ applied to the first electrode 120 can be formed to be connected with the first electrode 120.

If the first electrode 120 includes a plurality of sub electrodes, the power line W supplied with different electric field drop voltages $V_{ED}$ respectively applied to the sub electrodes can be formed to be connected with the first electrode 120.

Figure 17B:
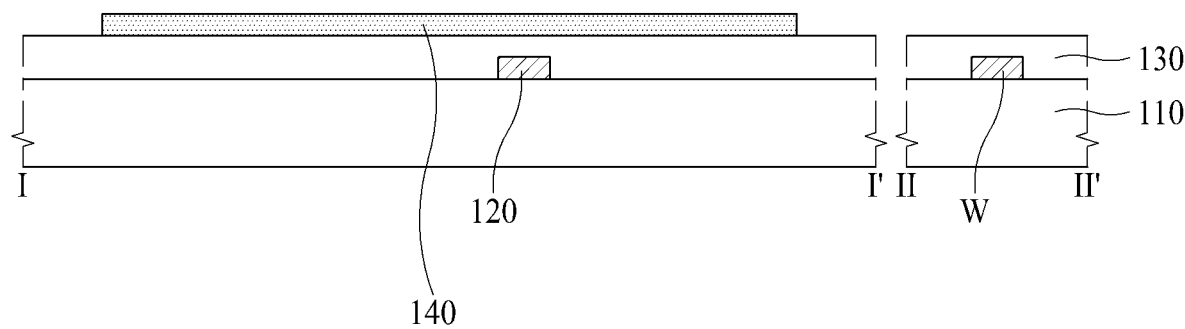

Afterwards, as shown in FIG. 17B, the buffer layer 130 is formed on the substrate 110 provided with the first electrode 120 to cover the first electrode 120, and the semiconductor layer 140 is formed on the buffer layer 130.

The semiconductor layer 140 includes an oxide semiconductor material, and can be formed of a single layer or a multi-layered structure of two or more layers. A mask process is performed to form the semiconductor layer 140.

For example, the semiconductor layer 140 can include at least one of IZO (InZnO)-, IGO(InGaO)-, ITO (InSnO)-, IGZO(InGaZnO)-, IGZTO (InGaZnSnO), GZTO (GaZnSnO)-, GZO (GaZnO)-, and ITZO (InSnZnO)-based oxide semiconductor materials.

Afterwards, as shown in FIGS. 17C to 17F, the gate insulating film 150 is formed to be patterned on the semiconductor layer 140 to overlap at least a middle area of the semiconductor layer 140, and the gate electrode 160 is formed to be patterned on the gate insulating film 150. A mask process can be performed to form the gate insulating film 150 and the gate electrode 160, and the gate insulating film 150 includes a GI tail which is not overlapped with the gate electrode 160.

Figure 17C:
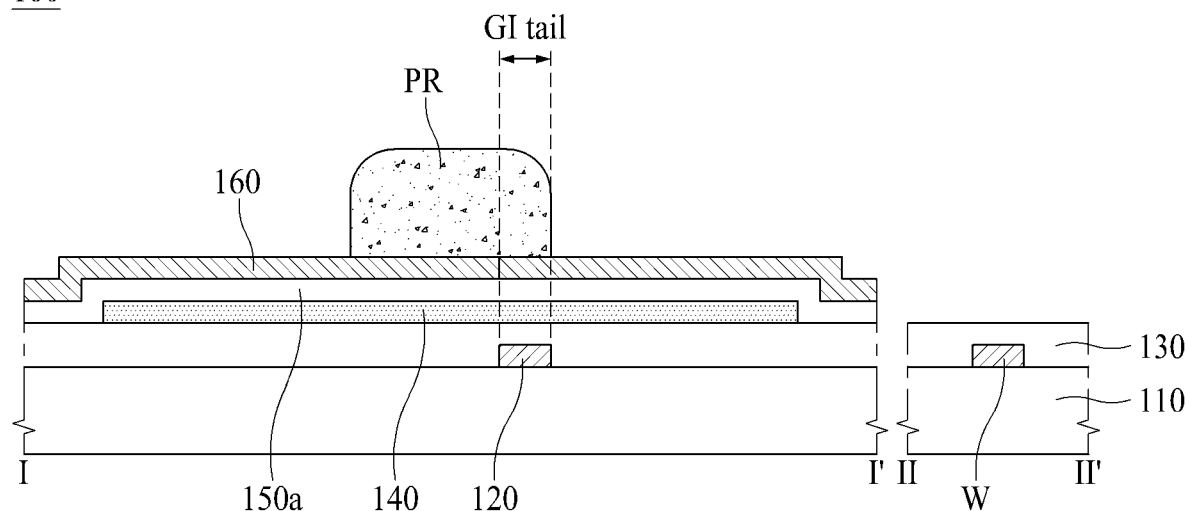

In detail, as shown in FIG. 17C, a gate insulating material is deposited to cover the semiconductor layer 140 and then a gate insulating material layer 150a is formed, and a gate electrode material is deposited on the gate insulating material layer 150a to form a gate electrode material layer 160a. A photoresist PR is formed on the gate electrode material layer 160a, and is arranged on the gate electrode material layer 160a properly depending on the position where the gate insulating film 150 and the gate electrode 160 are formed.

Figure 17D:
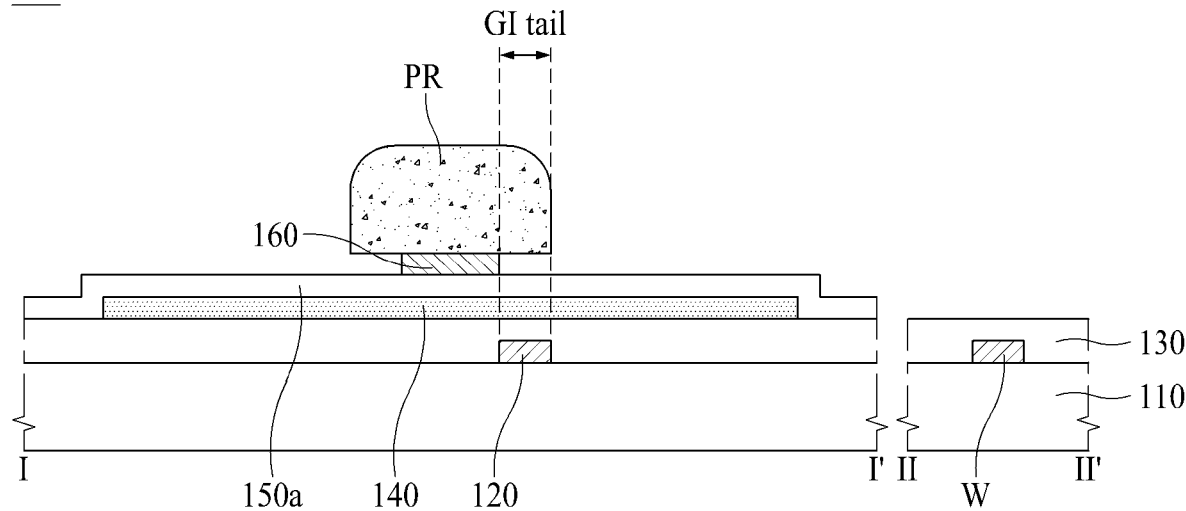

Afterwards, as shown in FIG. 17D, the gate electrode material layer 160a is patterned through a wet etching using the photoresist PR as a mask to form the gate electrode 160.

Figure 17E:
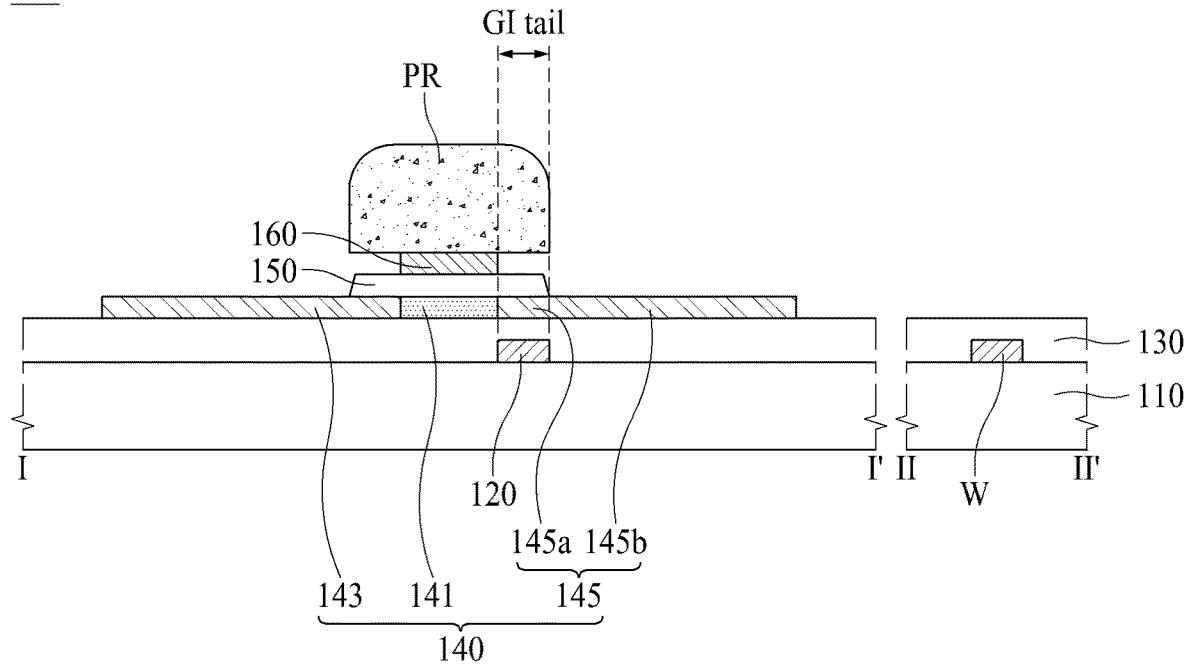
Figure 17F:
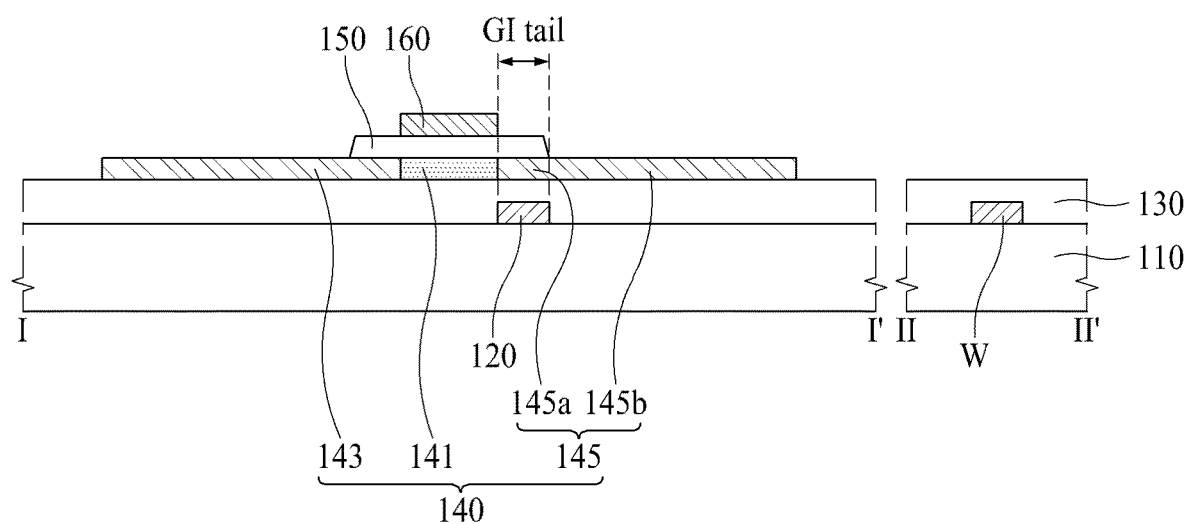

Afterwards, as shown in FIG. 17E, after the gate insulating material layer 150a is patterned through a wet etching using the photoresist PR as a mask to form the gate insulating film 150, the photoresist PR is removed (FIG. 17F).

At this time, the area of the semiconductor layer 140, which is overlapped with the gate electrode 160 is not conductorized and thus becomes the channel area 141, and the area of the semiconductor layer 140, which is not overlapped with the gate electrode 160 is conductorized and thus becomes the conductor portions 143 and 145.

The gate insulating film 150 can include an inorganic film, for example, at least one of SiOx and SiNx, or can include $Al_2O_3$, and can have a single film structure or multi-layered film structure.

The gate electrode 150 can include at least one of Al based metal such as Al or Al alloy, Ag based metal such as Ag or Ag alloy, Cu based metal such as Cu or Cu alloy, Mo based metal such as Mo or Mo alloy, Cr, Ta, Nd and Ti, and can be formed of a single layer or a multi-layer of two or more layers.

Figure 17G:
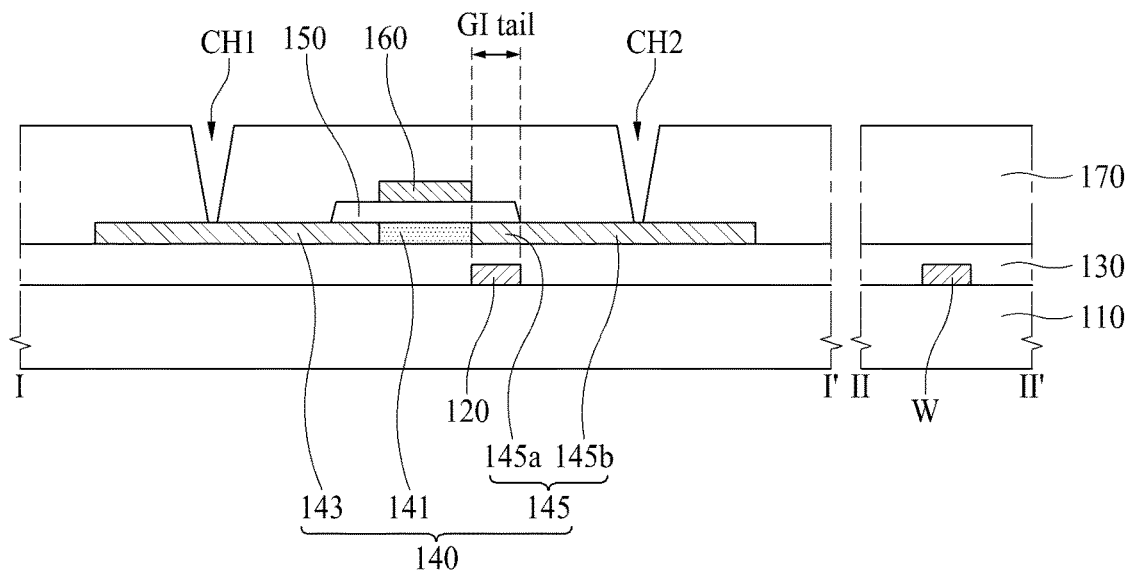

Afterwards, as shown in FIG. 17G, the insulating film 170 is formed on the buffer layer 130, protects the semiconductor layer 140, the gate insulating film 150 and the gate electrode 160 by covering them, and planarizes the upper portion of the thin film transistor 100.

The insulating film 170 can be made of an inorganic material, an organic material, or a deposited body of an organic material layer and an inorganic material layer, and can be formed of a single layer but can be formed of a multi-layered structure of two or more layers.

The first contact hole CH1 connected with the first conductor portion 143 is formed in the insulating film 170, and the second contact hole CH2 connected with the second conductor portion 145 is formed therein. A mask process can be performed to form the contact holes CH1 and CH2.

Figure 17H:
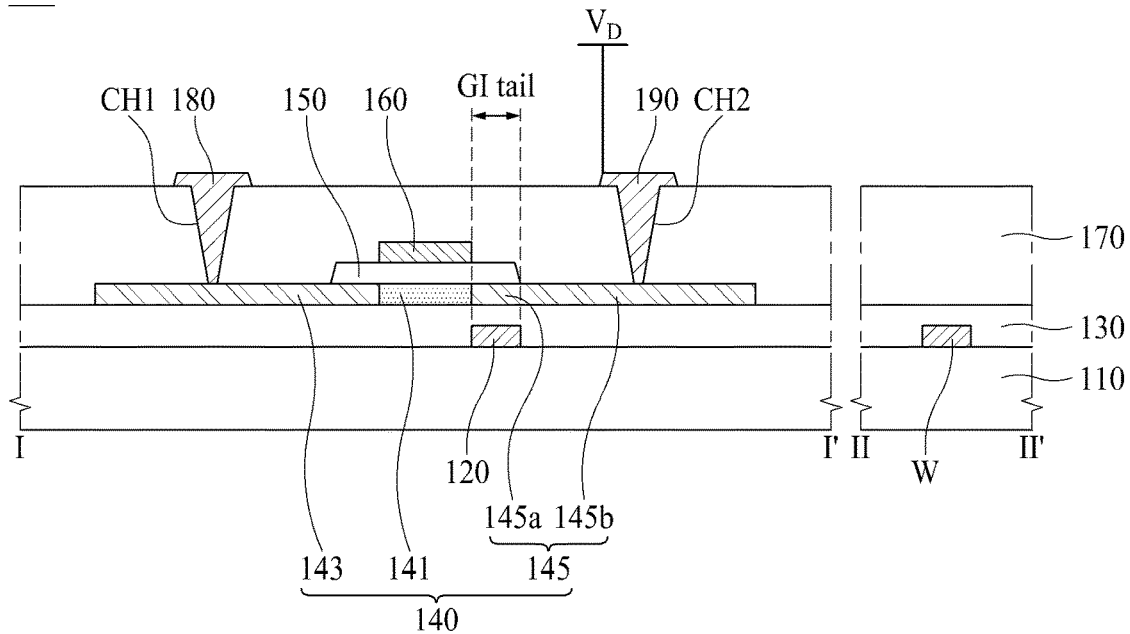

Afterwards, as shown in FIG. 17H, the second electrode 180 connected with the first conductor portion 143 through the first contact hole CH1 is formed on the insulating film 170, and the third electrode 190 connected with the second conductor portion 145 through the second contact hole CH2 is formed on the insulating film 170.

Each of the second and third electrodes 180 and 190 can be formed of a single layer or multi-layer made of any one of Mo, Al, Cr, W, Ti, Ni, Nd and Cu or their alloy.

Figure 18A:
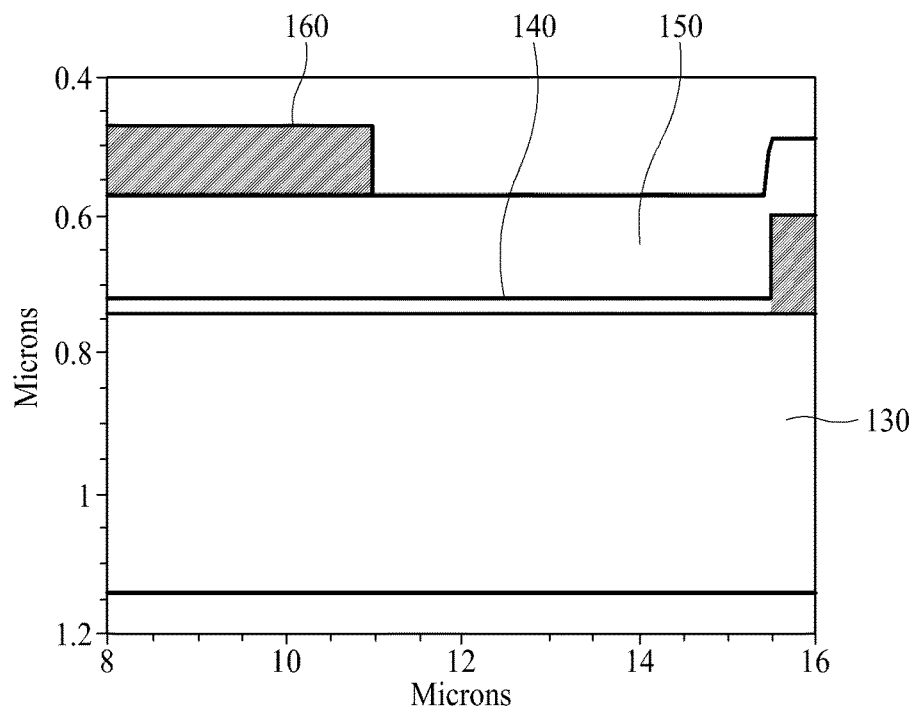
FIGS. 18A and 18B are views illustrating some area of each of a thin film transistor of a comparison example and a thin film transistor of the embodiment, which are used for simulation for checking an electric field change.
Figure 18B:
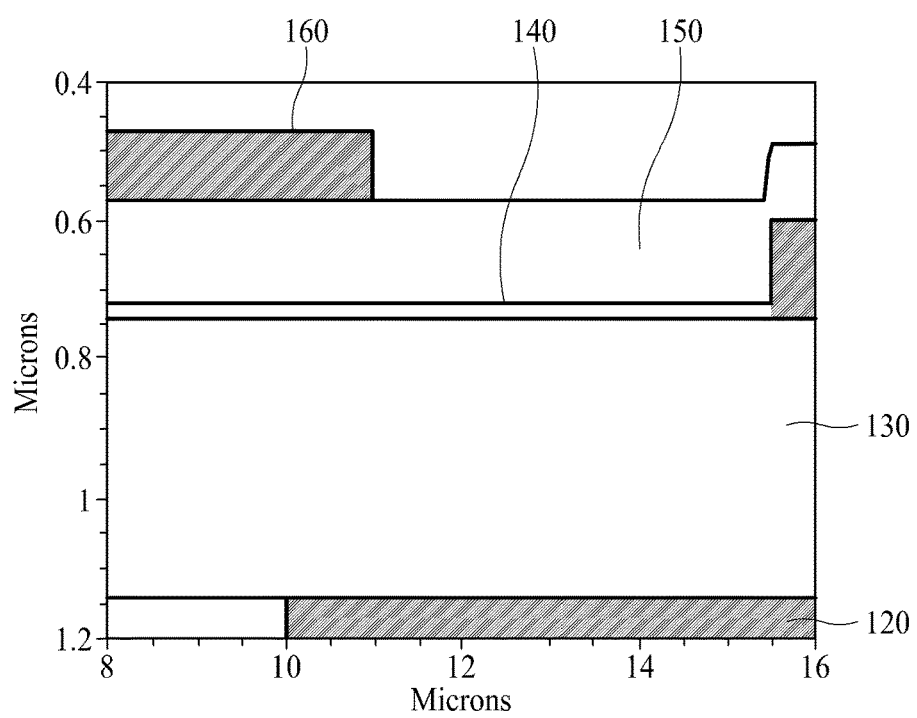
Figure 18C:
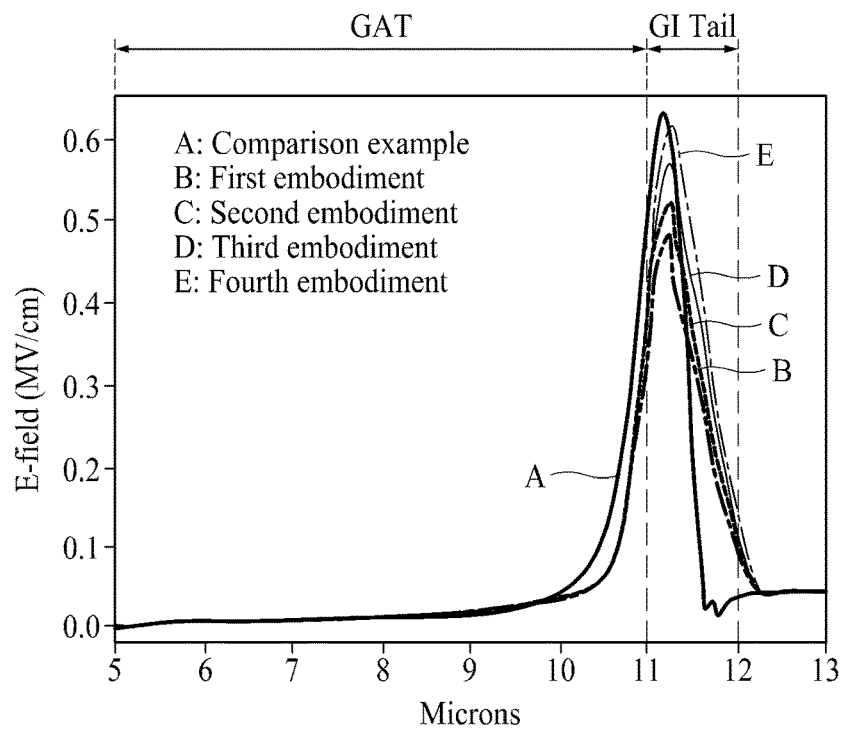
FIG. 18C is a graph illustrating electric field strength of a predetermined range in the thin film transistor shown in FIGS. 18A and 18B.
Figure 18D:
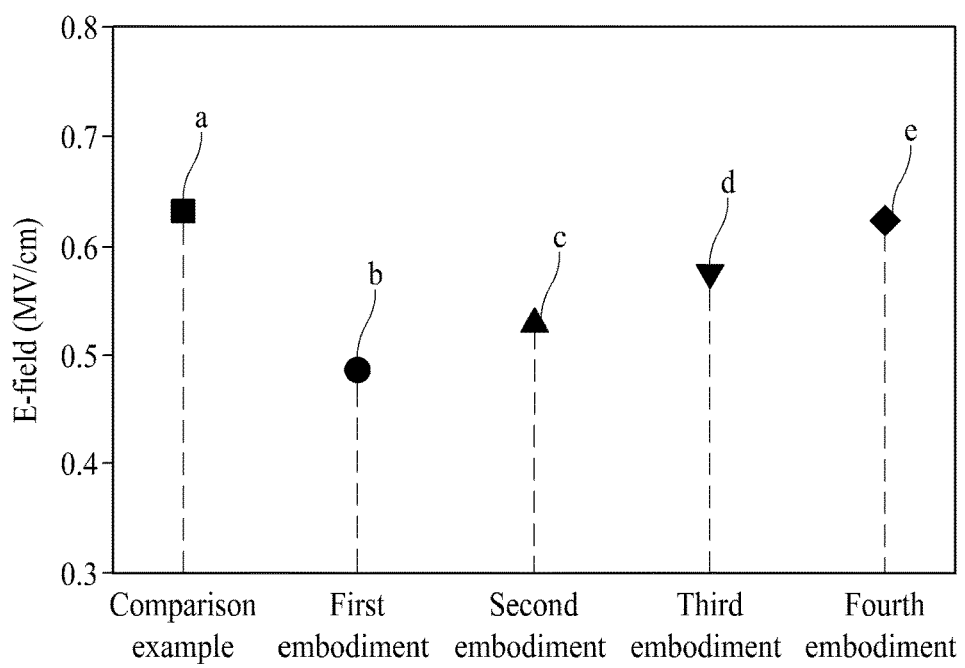
FIG. 18D is a graph illustrating maximum electric field strength of each curve in the graph of FIG. 18C.

FIGS. 18A and 18B are views illustrating some area of each of a thin film transistor of a comparison example and a thin film transistor of the embodiment, which are used for simulation for checking an electric field change, FIG. 18C is a graph illustrating electric field strength of a predetermined range in a thin film transistor shown in FIGS. 18A and 18B, and FIG. 18D is a graph illustrating maximum electric field strength of each curve in the graph of FIG. 18C.

In each of FIGS. 18A and 18B, X axis indicates a numeral value for defining a position of the electric field control electrode 120 and a range for measurement of electric field strength, and Y axis indicates a numeral value for thickness. The numeral value of the X axis corresponds to the numeral value of the X axis in the graph of FIG. 17C.

The electric field control electrode is not formed in the thin film transistor of FIG. 18A, and the electric field control electrode 120 is formed in the thin film transistor of FIG. 18B.

In order to obtain an electric field strength graph of the comparison example, in a state that 0V is applied to the thin film transistor of FIG. 18A as a source voltage VS, 1V is applied thereto as a gate voltage VG, and 40V is applied thereto as a drain voltage $V_D$, electric field strength of a predetermined range has been measured.

In order to obtain an electric field strength graph of the embodiments (embodiment 1 to embodiment 4), in a state that 0V is applied to the thin film transistor of FIG. 18B as a source voltage VS, 1V is applied thereto as a gate voltage VG, 3V is applied thereto as an electric field drop voltage $V_{ED}$ and 40V, 45V, 50V and 55V are respectively applied thereto as drain voltages $V_D$, electric field strength of a predetermined range has been measured.

In the graph of FIG. 18C, a curve A indicates electric field strength measured as the comparison example, and 'a' in FIG. 18D is a maximum electric field strength value in the curve A.

In the graph of FIG. 18C, each of curves B, C, D and E indicates electric field strength measured as the embodiments 1 to 4, and 'c', 'd' and 'e' in FIG. 18D are maximum electric field strength values in the curves B, C, D and E.

As shown in FIGS. 18C and 18D, since the maximum electric field strength values b, c, d and e according to the embodiments (embodiment 1 to embodiment 4) are lowered than the maximum electric strength field value 'a' according to the comparison example, resistance caused by the electric field can be lowered to prevent Ion deterioration from occurring, and mobility of carrier can be enhanced by the lowered resistance.

A thin film transistor, a display panel comprising the same, and a display apparatus according to one or more embodiments of the present disclosure will be described below.

According to an embodiment of the present disclosure, a thin film transistor can comprise a buffer layer on a substrate, a semiconductor layer on the buffer layer, and including a channel area, a first conductor portion and a second conductor portion, a gate insulating film on the semiconductor layer, a gate electrode on the gate insulating film, and an auxiliary electrode overlapped with the second conductor portion, the first conductor portion is extended from one side of the channel area, and becomes a source area, and the second conductor portion is extended from another side of the channel area, and becomes a drain area.

According to an embodiment of the present disclosure, the auxiliary electrode can be disposed between the substrate and the second conductor portion, and is covered by the buffer layer.

According to an embodiment of the present disclosure, the gate insulating film can include a tail which is not overlapped with the gate electrode and is overlapped with the auxiliary electrode, and the second conductor portion may include: a first area overlapped with the tail of the gate insulating film, and a second area which is not overlapped with the gate insulating film, and the first area can be disposed between the channel area and the second area.

According to an embodiment of the present disclosure, the auxiliary electrode can be overlapped with at least a portion of the first area.

According to an embodiment of the present disclosure, the auxiliary electrode can be overlapped with at least a portion of the first area, and one side of the auxiliary electrode is extended to be overlapped with at least a portion of the channel area.

According to an embodiment of the present disclosure, a width of an area where the auxiliary electrode can be overlapped with the first area is the same as or different from a width of an area where the auxiliary electrode is overlapped with the channel area.

According to an embodiment of the present disclosure, the auxiliary electrode can be overlapped with at least a portion of the first area, and another side of the auxiliary electrode is extended to be overlapped with at least a portion of the second area.

According to an embodiment of the present disclosure, a width of an area where the auxiliary electrode is overlapped with the first area can be the same as or different from a width of an area where the auxiliary electrode is overlapped with the second area.

According to an embodiment of the present disclosure, the auxiliary electrode is overlapped with the first area, one side of the auxiliary electrode is extended to be overlapped with at least a portion of the channel area, and another side of the auxiliary electrode is extended to be overlapped with at least a portion of the second area.

According to an embodiment of the present disclosure, a width of an area where the auxiliary electrode is overlapped with the channel area and a width of an area where the auxiliary electrode is overlapped with the second area can be the same as or different from a width of an area where the auxiliary electrode is overlapped with the first area.

According to an embodiment of the present disclosure, a width of an area where the auxiliary electrode is overlapped with the channel area can be the same as or different from a width of an area where the auxiliary electrode is overlapped with the second area.

According to an embodiment of the present disclosure, the auxiliary electrode can be connected with a power line supplied with an electric field drop voltage for dropping an electric field formed in the first area.

According to an embodiment of the present disclosure, the electric field drop voltage can be a positive voltage lower than a drain voltage applied to the second conductor portion.

According to an embodiment of the present disclosure, the auxiliary electrode can include a plurality of sub electrodes spaced apart from one another at a predetermined distance.

According to an embodiment of the present disclosure, each of the plurality of sub electrodes can be connected with a power line supplied with electric field drop voltages of different values for dropping an electric field formed in the first area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor comprising:
a buffer layer on a substrate;
a semiconductor layer on the buffer layer, and including a channel area, a first conductor portion and a second conductor portion;
a gate insulating film on the semiconductor layer;
a gate electrode on the gate insulating film; and
an auxiliary electrode overlapped with the second conductor portion in a vertical direction relative to the substrate,
wherein a portion of the buffer layer is between the auxiliary electrode and the second conductor portion, and the auxiliary electrode does not overlap with a center of the channel area,
wherein the first conductor portion is extended from one side of the channel area, and becomes a source area, and
the second conductor portion is extended from another side of the channel area, and becomes a drain area.

2. The thin film transistor of claim 1, wherein the auxiliary electrode is disposed between the substrate and the second conductor portion, and is covered by the buffer layer.

3. The thin film transistor of claim 1, wherein the gate insulating film includes a tail which is not overlapped with the gate electrode and is overlapped with the auxiliary electrode, and
the second conductor portion includes:
a first area overlapped with tail of the gate insulating film; and
a second area which is not overlapped with the gate insulating film,
wherein the first area is disposed between the channel area and the second area.

4. The thin film transistor of claim 3, wherein the auxiliary electrode is overlapped with at least a portion of the first area.

5. The thin film transistor of claim 3, wherein the auxiliary electrode is overlapped with at least a portion of the first area, and one side of the auxiliary electrode is extended to be overlapped with at least a portion of the channel area.

6. The thin film transistor of claim 5, wherein a width of an area where the auxiliary electrode is overlapped with the first area is the same as or different from a width of an area where the auxiliary electrode is overlapped with the channel area.

7. The thin film transistor of claim 3, wherein the auxiliary electrode is overlapped with at least a portion of the first area, and another side of the auxiliary electrode is extended to be overlapped with at least a portion of the second area.

8. The thin film transistor of claim 7, wherein a width of an area where the auxiliary electrode is overlapped with the first area is the same as or different from a width of an area where the auxiliary electrode is overlapped with the second area.

9. The thin film transistor of claim 3, wherein the auxiliary electrode is overlapped with the first area,
one side of the auxiliary electrode is extended to be overlapped with at least a portion of the channel area, and
another side of the auxiliary electrode is extended to be overlapped with at least a portion of the second area.

10. The thin film transistor of claim 9, wherein a width of an area where the auxiliary electrode is overlapped with the channel area and a width of an area where the auxiliary electrode is overlapped with the second area are the same as or different from a width of an area where the auxiliary electrode is overlapped with the first area.

11. The thin film transistor of claim 9, wherein a width of an area where the auxiliary electrode is overlapped with the channel area is the same as or different from a width of an area where the auxiliary electrode is overlapped with the second area.

12. The thin film transistor of claim 3, wherein the auxiliary electrode is connected with a power line supplied with an electric field drop voltage for dropping an electric field formed in the first area.

13. The thin film transistor of claim 12, wherein the electric field drop voltage is a positive voltage lower than a drain voltage applied to the second conductor portion.

14. The thin film transistor of claim 3, wherein the auxiliary electrode includes a plurality of sub electrodes spaced apart from one another at a predetermined distance.

15. The thin film transistor of claim 14, wherein each of the plurality of sub electrodes is connected with a power line supplied with electric field drop voltages of different values for dropping an electric field formed in the first area.

16. A display panel comprising:
a substrate having a display area and a non-display area;
a plurality of pixels disposed in the display area and connected to a gate line and a data line; and
a gate driver disposed in the non-display area, and having a shift register circuit for driving the gate line,
wherein the shift register circuit is embodied by a plurality of thin film transistors disposed on the substrate, and
at least one of the plurality of thin film transistors is the thin film transistor of claim 1.

17. A display apparatus comprising the display panel of claim 16.

18. The display apparatus of claim 17, wherein each of the plurality of pixels includes:
a pixel circuit connected to the gate line and the data line; and
a light emitting diode connected to the pixel circuit.

19. A thin film transistor comprising:
a buffer layer on a substrate;
a semiconductor layer on the buffer layer, and including a channel area, a first conductor portion and a second conductor portion;
a gate insulating film on the semiconductor layer;
a gate electrode on the gate insulating film; and
an auxiliary electrode overlapped with the second conductor portion,
wherein the first conductor portion is extended from one side of the channel area, and becomes a source area, and
the second conductor portion is extended from another side of the channel area, and becomes a drain area,
wherein the gate insulating film includes a tail which is not overlapped with the gate electrode and is overlapped with the auxiliary electrode, and
the second conductor portion includes:
a first area overlapped with tail of the gate insulating film; and
a second area which is not overlapped with the gate insulating film,
wherein the first area is disposed between the channel area and the second area.

* * * * *